United States Patent
Sasaki et al.

(10) Patent No.: US 11,037,815 B2
(45) Date of Patent: Jun. 15, 2021

(54) DECHUCK CONTROL METHOD AND PLASMA PROCESSING APPARATUS

(71) Applicant: Tokyo Electron Limited, Tokyo (JP)

(72) Inventors: Yasuharu Sasaki, Miyagi (JP); Katsunori Hirai, Miyagi (JP); Junichi Sasaki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 301 days.

(21) Appl. No.: 16/116,193

(22) Filed: Aug. 29, 2018

(65) Prior Publication Data

US 2019/0074209 A1 Mar. 7, 2019

(30) Foreign Application Priority Data

Sep. 4, 2017 (JP) .............................. JP2017-169608

(51) Int. Cl.
| | | |
|---|---|---|
| H01L 21/683 | (2006.01) | |
| H01L 21/687 | (2006.01) | |
| H01L 21/67 | (2006.01) | |
| H01J 37/32 | (2006.01) | |

(52) U.S. Cl.
CPC .. *H01L 21/68742* (2013.01); *H01J 37/32697* (2013.01); *H01J 37/32724* (2013.01); *H01L 21/67109* (2013.01); *H01L 21/6833* (2013.01); *H01J 2237/24564* (2013.01)

(58) Field of Classification Search
CPC ................................................ H01J 27/32697
See application file for complete search history.

(56) References Cited

U.S. PATENT DOCUMENTS

| | | | |
|---|---|---|---|
| 5,874,361 A | 2/1999 | Collins et al. | |
| 2007/0285769 A1 | 12/2007 | Shirota et al. | |
| 2007/0285869 A1* | 12/2007 | Howald | H01L 21/6831 361/234 |
| 2010/0208409 A1* | 8/2010 | Bluck | H01L 21/683 361/234 |
| 2013/0153147 A1 | 6/2013 | Senzaki et al. | |
| 2018/0301363 A1 | 10/2018 | Chito | |

FOREIGN PATENT DOCUMENTS

| | | |
|---|---|---|
| CN | 101645395 | 2/2010 |
| JP | 2010-212678 | 9/2010 |
| JP | 2010-272709 | 12/2010 |
| JP | 2013-149935 | 8/2013 |

\* cited by examiner

*Primary Examiner* — Scott Bauer
(74) *Attorney, Agent, or Firm* — IPUSA, PLLC

(57) ABSTRACT

A dechuck control method of dechucking a processed object electrostatically attracted to an electrostatic chuck is provided. The method includes a step of dechucking the processed object by lifting the processed object with a supporting mechanism. The dechucking step is performed while applying a given voltage to an electrode of the electrostatic chuck.

12 Claims, 6 Drawing Sheets

DECHUCK CONTROL METHOD AND PLASMA PROCESSING APPARATUS

CROSS-REFERENCE TO RELATED APPLICATIONS

This patent application is based upon and claims the benefit of priority of Japanese Patent Application No. 2017-169608 filed on Sep. 4, 2017, the entire contents of which are incorporated herein by reference.

BACKGROUND OF THE INVENTION

1. Field of the Invention

The present invention generally relates to a dechuck control method and a plasma processing apparatus.

2. Description of the Related Art

After plasma processing is applied to a wafer attracted to a mounting base electrostatically by an electrostatic chuck, the wafer is removed from the mounting base by lifting the wafer with supporting pins, and the wafer is unloaded from a plasma processing chamber. If electrical charge remains on a surface of the electrostatic chuck, attractive force occurs between the electrostatic chuck and the wafer by the electrical charge remaining on the electrostatic chuck. Because of the attractive force, the wafer may be shifted or broken, and the wafer may not be removed as expected. To avoid such problems, a technique for removing remaining electrical charge on a chuck electrode is known. In this technique, after plasma processing of a wafer, voltage is applied to a chuck electrode, which has an opposite polarity and the same magnitude of voltage having been applied to the chuck electrode during the plasma processing, in order to remove remaining electrical charge on a chuck electrode. After removing the remaining electrical charge, applying voltage to the chuck electrode is stopped, and the wafer is removed by lifting the wafer with supporting pins (see Patent Document 1, for example).

An electrical charge removal method disclosed in Patent Document 1 includes: a step of identifying an amount of remaining electrical charge on a surface of a chuck electrode and polarity of the remaining electrical charge, and applying, to the chuck electrode, voltage for supplying an electrical charge which is the same amount as the remaining electrical charge and which has an opposite polarity; a step of reducing pressure by discharging inert gas in the processing chamber while applying voltage to the chuck electrode based on a monitoring result of a pressure of heat transmitting gas; and a step of stopping applying the voltage to the chuck electrode and removing a processed object from the electrostatic chuck using support pins.

However, even when the above mentioned electrical charge removal method is applied, a case in which electrical charge remains on a surface of the electrostatic chuck may occur. In this case, an accident such as breakage of a wafer may occur, and the wafer may not be removed as expected.

CITATION LIST

Patent Document

[Patent Document 1] Japanese Laid-open Patent Application Publication No. 2013-149935

SUMMARY OF THE INVENTION

In one aspect, the present invention aims at facilitating removal of a processed object from an electrostatic chuck.

To solve the above problem, according to an embodiment of the present invention, a dechuck control method of dechucking a processed object electrostatically attracted to an electrostatic chuck is provided. The method includes a step of dechucking the processed object by lifting the processed object with a supporting mechanism. The dechucking step is performed while applying a given voltage to an electrode of the electrostatic chuck.

According to another embodiment of the present invention, there is provision of a plasma processing apparatus including an electrostatic chuck configured to attract a processed object electrostatically, a DC power source applying a voltage to an electrode of the electrostatic chuck, and a control unit. The control unit is configured to dechuck the processed object by lifting the processed object with a supporting mechanism, while applying a given voltage to the electrode of the electrostatic chuck.

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Overall Configuration of Plasma Processing Apparatus]

Figure 1:
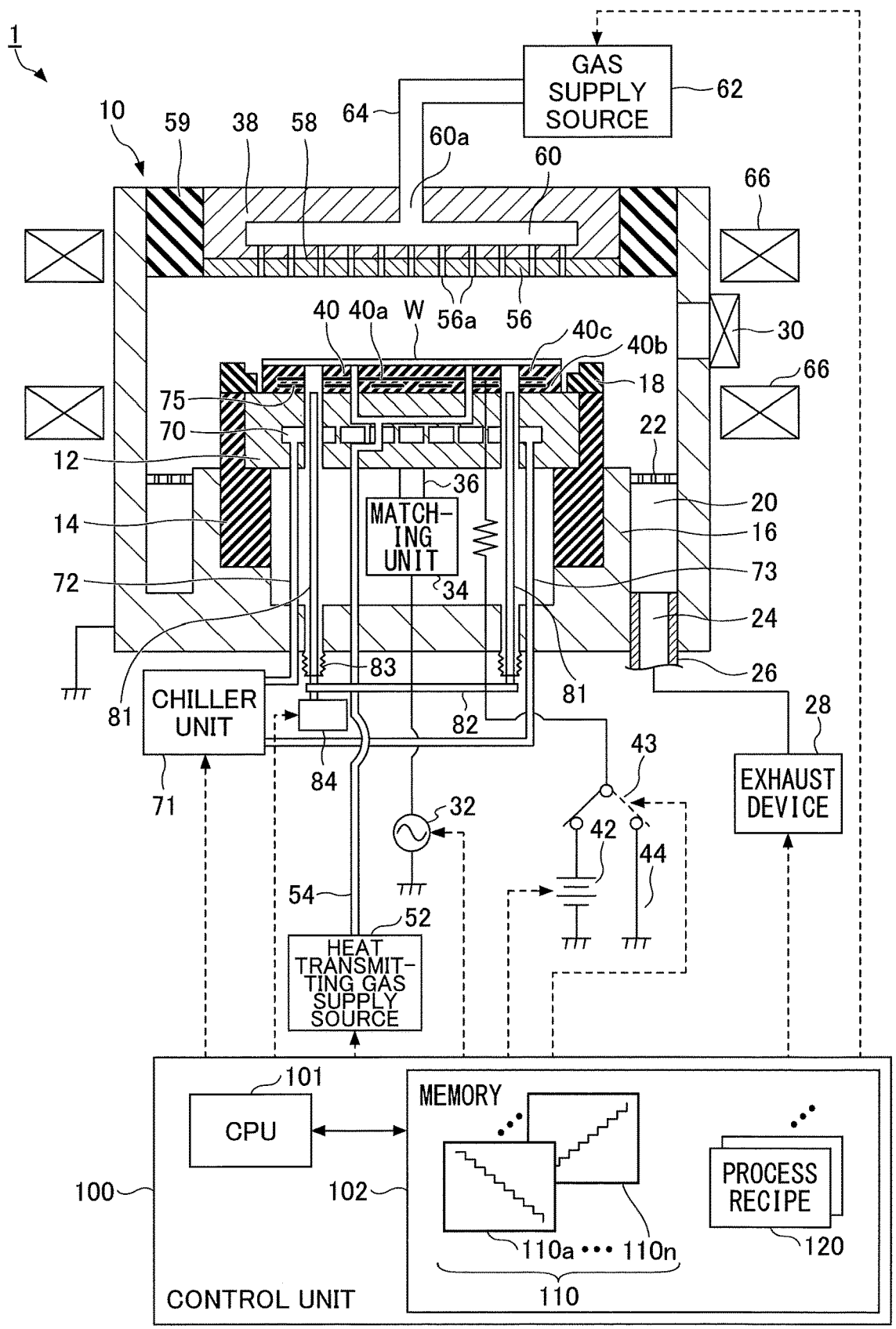
FIG. 1 is a diagram illustrating an example of a configuration of a plasma processing apparatus according to an embodiment.

First, an overall configuration of a plasma processing apparatus according to the present embodiment will be described with reference to FIG. 1. FIG. 1 is a diagram illustrating an example of a configuration of the plasma processing apparatus 1 according to the present embodiment.

The plasma processing apparatus 1 illustrated in FIG. 1 includes a processing vessel 10 of a cylindrical shape made from metal such as aluminum or stainless steel. The processing vessel 10 is electrically grounded. In the processing vessel 10, a plasma process such as etching, deposition, and ashing is applied to a semiconductor wafer W (which may also be referred to as a "wafer W").

A mounting base 12 is provided in the processing vessel 10. The mounting base 12 is formed of aluminum, and is supported, via a cylindrical holding unit 14, by a cylindrical supporting unit 16 vertically extending upward from a bottom of the processing vessel 10. On an upper surface of the cylindrical holding unit 14, an annular focus ring 18 is disposed so as to surround an upper surface of the mounting base 12. The focus ring 18 is formed of quartz, for example.

An annular baffle plate 22 is attached to an exhaust path 20 formed between an inner wall of the processing vessel 10 and the cylindrical supporting unit 16. An exhaust port 24 is provided at a bottom of the exhaust path 20, and the exhaust port 24 is connected to an exhaust device 28 via an exhaust pipe 26. The exhaust device 28 is equipped with a device such as a vacuum pump, and can reduce a pressure in the processing vessel 10 to a desirable quality of vacuum. At a side wall of the processing vessel 10, a gate valve 30 is provided. Opening and closing of the gate valve 30 is performed when the wafer W is loaded or unloaded.

A high frequency power source 32 for outputting high frequency (radio frequency) electric power for generating plasma is connected to the mounting base 12 via a feeding rod 36 and a matching unit 34. The high frequency power source 32 applies, to the mounting base 12, high frequency electric power such as 60 MHz. Another high frequency power source for outputting high frequency (radio frequency) electric power for bias voltage may be connected to the mounting base 12 via a matching unit. Frequency of the electric power output from this high frequency power source (for bias voltage) is lower than the frequency of the electric power output from the high frequency power source 32. Because the mounting base 12 is configured as mentioned above, the mounting base 12 acts as a lower electrode. A gas shower head 38 is provided at a ceiling of the processing vessel 10, and the gas shower head 38 acts as an upper electrode of a ground potential. The high frequency electric power for generating plasma supplied from the high frequency power source 32 is capacitively applied between the mounting base 12 and the gas shower head 38.

The gas shower head 38 is mounted to an opening of the ceiling of the processing vessel 10 through a shield ring 59 covering an outer edge of the gas shower head 38, such that the opening is closed with the gas shower head 38. The gas shower head 38 includes an electrode plate 56 having a large number of gas holes 56a, and an electrode supporting member 58 for detachably supporting the electrode plate 56. Inside the electrode supporting member 58, a buffer chamber 60 is provided. A gas supply source 62 is connected to a gas inlet 60a of the buffer chamber 60 via a gas supplying pipe 64. According to the above configuration, desired gas can be supplied from the gas supply source 62 to the inside of the processing vessel 10 via the gas shower head 38.

An electrostatic chuck 40 for attracting the wafer W electrostatically is disposed on the mounting base 12. The electrostatic chuck 40 is configured such that a sheet-like chuck electrode 40a formed of conductive film is embedded between insulating layer members 40b and 40c (the insulating layer members 40b and 40c are a set of an insulating member).

The chuck electrode 40a is connected to a direct current power source (DC power source) 42 or a ground (ground part) 44 via a switch 43. When the switch 43 is set so that the chuck electrode 40a is connected to the DC power source 42, a given voltage is applied from the DC power source 42 to the chuck electrode 40a, and the wafer W is attracted and held on the electrostatic chuck 40 by Coulomb force.

When the switch 43 is switched to a state in which the chuck electrode 40a is connected to the ground 44, applying voltage to the chuck electrode 40a is stopped. In the following, "application of voltage to the chuck electrode 40a" or "turning on voltage to the chuck electrode 40a" represents a state in which the chuck electrode 40a is connected to the DC power source 42, and "stop application of voltage to the chuck electrode 40a" or "turning off voltage to the chuck electrode 40a" represents a state in which the chuck electrode 40a is connected to the ground 44.

A heat transmitting gas supply source 52 supplies heat transmitting gas such as He gas or Ar gas, through a gas supply line 54, between an upper surface of the electrostatic chuck 40 and the lower surface of the wafer W. In the mounting base 12, a number of supporting pins 81 (for example, three supporting pins) are provided, which lift or lower the wafer when the wafer is passed to (or received from) a conveying arm (not illustrated). The supporting pins 81 move upward and downward by power of a motor 84 which is transmitted via a connecting member 82. Lower portions of the supporting pins 81 extend out of the processing vessel 10, from through holes for the supporting pins 81 provided at a bottom of the processing vessel 10. At each of the through holes for the supporting pins 81, a bellows 83 is provided in order to maintain airtightness inside the processing vessel 10. The supporting pins 81 are an example of a supporting mechanism for lifting the wafer W.

Around the processing vessel 10, two magnets 66 of annular shapes are provided coaxially with the processing vessel 10. The two magnets 66 are arranged vertically. An RF electrical field of a vertical direction is formed by the high frequency power source 32, and high density plasma is generated in a vicinity of a surface of the mounting base 12 by a high-frequency electrical discharge. An electromagnetic field caused by the magnets 66 controls plasma generated in a plasma generating space.

Inside the mounting base 12, a coolant passage 70 is provided. Coolant that is controlled at a predetermined temperature by a chiller unit 71 is output from the chiller unit 71, is supplied to the coolant passage 70 via a pipe 72, and returns to the chiller unit 71 through a pipe 73. Inside the electrostatic chuck 40, a heater 75 is embedded. When power from an AC power source (not illustrated) is supplied to the heater 75, the mounting base 12 is heated by heat from the heater 75. As described above, because the mounting base 12 is cooled by the coolant flowing through the coolant passage 70 and is heated by the heat supplied from the heater 75, a temperature of the mounting base 12 is controlled. Accordingly, the wafer W on the electrostatic chuck 40 can be controlled at a desired temperature.

A control unit 100 controls each element of the plasma processing apparatus 1 such as the gas supply source 62, the exhaust device 28, the DC power source 42, the switch 43, the high frequency power source 32, the heat transmitting gas supply source 52, the motor 84, and the chiller unit 71. The control unit 100 is also connected to a host computer or the like, with which communication is mutually enabled.

The control unit 100 includes a CPU (Central Processing Unit) 101, a memory 102 configured by, for example, a ROM (Read Only Memory) or a RAM (Random Access Memory). Among multiple process recipes 120 stored in the memory 102, the CPU 101 selects one process recipe 120 describing a procedure for processing the wafer W, and performs a specific plasma process in accordance with the selected process recipe 120. In each process recipe 120, control information of the plasma processing apparatus 1 for realizing a process condition is defined. Examples of the control information include a time required for a process, a temperature inside the processing vessel (such as a temperature of the upper electrode, a temperature of an inner wall of the processing vessel, and a temperature of the electrostatic chuck (ESC)), a pressure (of exhaust gas), power or voltage of the high (radio) frequency power source, an amount of flow of each process gas, and an amount of flow of heat transmitting gas.

[Plasma Process]

Figure 2:
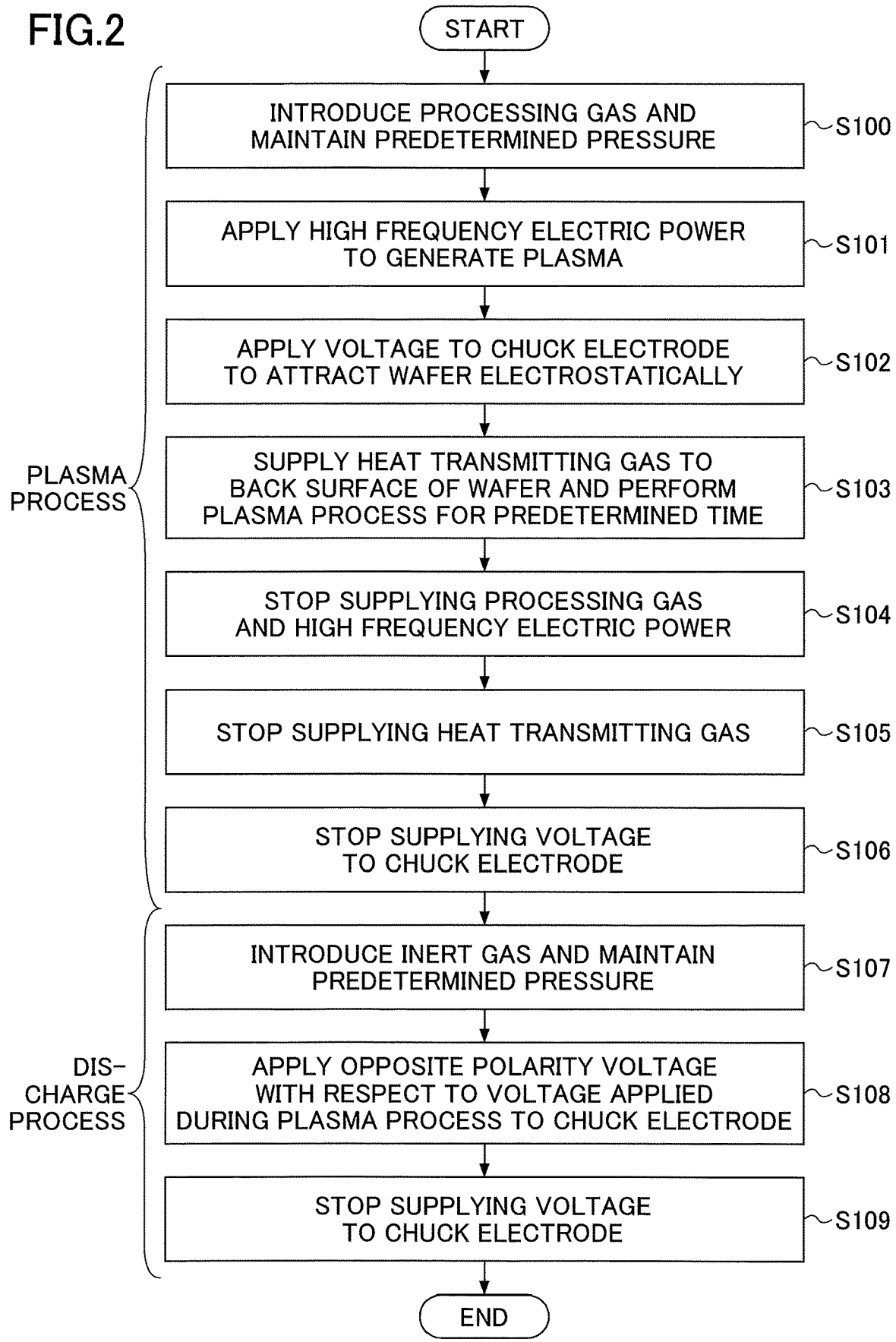
FIG. 2 is a flowchart illustrating an example of a conventional dechuck control process.

An operation flow of a plasma process, such as etching, performed by using the above described plasma processing apparatus 1 based on the process recipe 120, will be described with reference to FIG. 2. FIG. 2 is a flowchart illustrating an example of a conventional dechuck control process. Before the process illustrated in FIG. 2 is executed, the following operations are executed. First, the gate valve 30 is opened and a wafer W held by the conveying arm is loaded into the processing vessel 10. Next, the wafer W is lifted from the conveying arm by the supporting pins 81 projecting from an upper surface of the electrostatic chuck 40, and the wafer W is held by the supporting pins 81. Subsequently, the conveying arm exits out of the processing vessel 10, and the wafer W is placed on the electrostatic chuck 40 by lowering the supporting pins 81 below the electrostatic chuck 40. After the wafer is placed on the electrostatic chuck 40 and the gate valve 30 is closed, gas in the processing vessel 10 is discharged by the exhaust device 28 such as a vacuum pump.

The plasma process illustrated in FIG. 2 is controlled by the CPU 101 in the control unit 100. When the plasma process illustrated in FIG. 2 is started, the gas supply source 62 introduces process gas such as etching gas, from the gas shower head 38 into the processing vessel 10. Further, the exhaust device 28 decreases a pressure in the processing vessel 10, and maintains the inside of the processing vessel 10 at a predetermined pressure (step S100). Next, the high frequency power source 32 excites the process gas to generate plasma, by applying high frequency electric power to the mounting base 12 (step S101). That is, the process gas is excited by the high frequency electric power supplied from the high frequency power source 32. As a result, plasma is generated in a plasma generating space between the upper electrode (gas shower head 38) and the lower electrode (mounting base 12).

Next, the wafer W is caused to be attracted electrostatically on the electrostatic chuck 40, by applying voltage to the chuck electrode 40*a* (S102). Next, heat transmitting gas is supplied between the lower surface of the wafer W and the upper surface of the electrostatic chuck 40, and a plasma process to the wafer W is performed for a predetermined period of time, using radicals or ions in the generated plasma (S103). After the plasma process, supplying the process gas and the high frequency electric power is stopped (OFF) (S104), supplying the heat transmitting gas is stopped (OFF) (S105), and supplying voltage to the chuck electrode 40*a* is stopped (S106).

[Discharge Process]

Next, an example of a conventional discharge process performed when a wafer is removed from the electrostatic chuck 40. After the plasma process to the wafer W is completed, the CPU 101 executes a process to introduce inert gas into the processing vessel 10, and to maintain the processing vessel 10 at a predetermined pressure (S107). Next, discharging is performed by applying (ON) voltage, having an opposite polarity and the same magnitude of the voltage having been applied to the chuck electrode 40*a* during the plasma process, to the chuck electrode 40*a* (S108). Next, the CPU 101 turns off the voltage to the chuck electrode 40*a* by switching to a state of the switch 43 in which the chuck electrode 40*a* is connected to the ground 44 (S109), and the discharge process terminates.

After the above mentioned process terminates, the CPU 101 raises the supporting pins 81 to lift the wafer W from the electrostatic chuck 40, and removes (dechucks) the wafer W from the electrostatic chuck 40. Subsequently, when the gate valve 30 is opened and the conveying arm is loaded into the processing vessel 10, the CPU 101 lowers the supporting pins 81, and thus the wafer W is held on the conveying arm. Next, the conveying arm exits out of the processing vessel 10 and a next wafer is loaded into the processing vessel 10. By repeating the above operations, wafers are processed continuously.

[State of Remaining Charge]

Figure 3A:
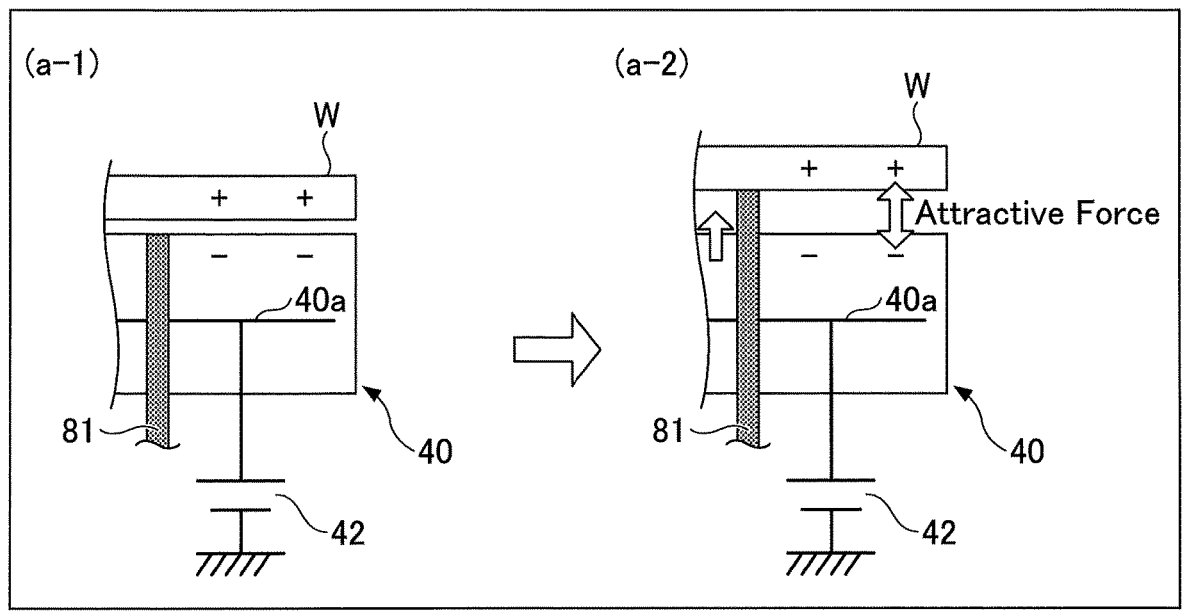
FIG. 3A is a diagram illustrating a state of an electrostatic chuck and a wafer on which electrical charge is remaining.

However, even when the above discharge process is executed, electrical charge may remain on the surface of the electrostatic chuck 40. As a result, when a wafer W is to be removed from the electrostatic chuck 40 by lifting the supporting pins 81, the wafer W may not be removed properly because of the remaining charge. The reason will be described with reference to FIG. 3A. FIG. 3A is a diagram illustrating a state of the electrostatic chuck 40 and the wafer W on which electrical charge is remaining after the above described conventional discharge process. Note that a left diagram in FIG. 3A will be referred to as a "diagram (a-1)", and a right diagram in FIG. 3A will be referred to as a "diagram (a-2)".

As illustrated in the diagram (a-1), during a plasma process of the wafer W, remaining charge occurs on the surface of the electrostatic chuck 40. In the example illustrated in the diagram (a-1), the remaining charge is negative charge that has moved to the surface of the electrostatic chuck 40. However, the remaining charge may be positive charge in a case in which the positive charge has moved to the surface of the electrostatic chuck 40.

If the supporting pins 81 are to be lifted when the electrostatic chuck 40 is in the above mentioned state, as illustrated in the diagram (a-1), attractive force occurs because of the negative charge on the surface of the electrostatic chuck 40 and positive charge on the back surface of the wafer W attracted by the remaining charge. Accordingly, as it requires a large force (torque supplied from the motor 84) to actuate the supporting pins 81, dechucking the wafer W is difficult.

Therefore, in the conventional discharge process, in order to remove remaining charge on the surface of the electrostatic chuck 40, voltage having an opposite polarity and the same magnitude of the voltage having been applied to the chuck electrode 40*a* during a plasma process of the wafer W, is applied. By applying the voltage, remaining charge on the surface of the electrostatic chuck 40 is removed (discharged).

In the example illustrated in the diagram (a-1), by applying a voltage having an opposite polarity and the same magnitude of the voltage having been applied to the chuck electrode 40*a*, discharging (removal of negative charge on the surface of the electrostatic chuck 40) is performed. However, even if the above mentioned discharge process is performed, remaining charge may still remain on the surface of the electrostatic chuck 40. That is, it is difficult to completely remove remaining charge.

[Dechuck Control Method]

In a dechuck control method according to the present embodiment, when the wafer W is to be lifted by the supporting pins 81, a force applied to the supporting pins 81 (which is a torque supplied from the motor 84 to lift the supporting pins 81; hereinafter, the force may also be referred to as a "torque applied to the supporting pins 81") is detected, and a determination is made as to whether the detected torque is not more than a predetermined threshold or not. As a result of the determination, if the detected torque is not more than the predetermined threshold, it is determined that the wafer W can be dechucked.

Figure 3B:
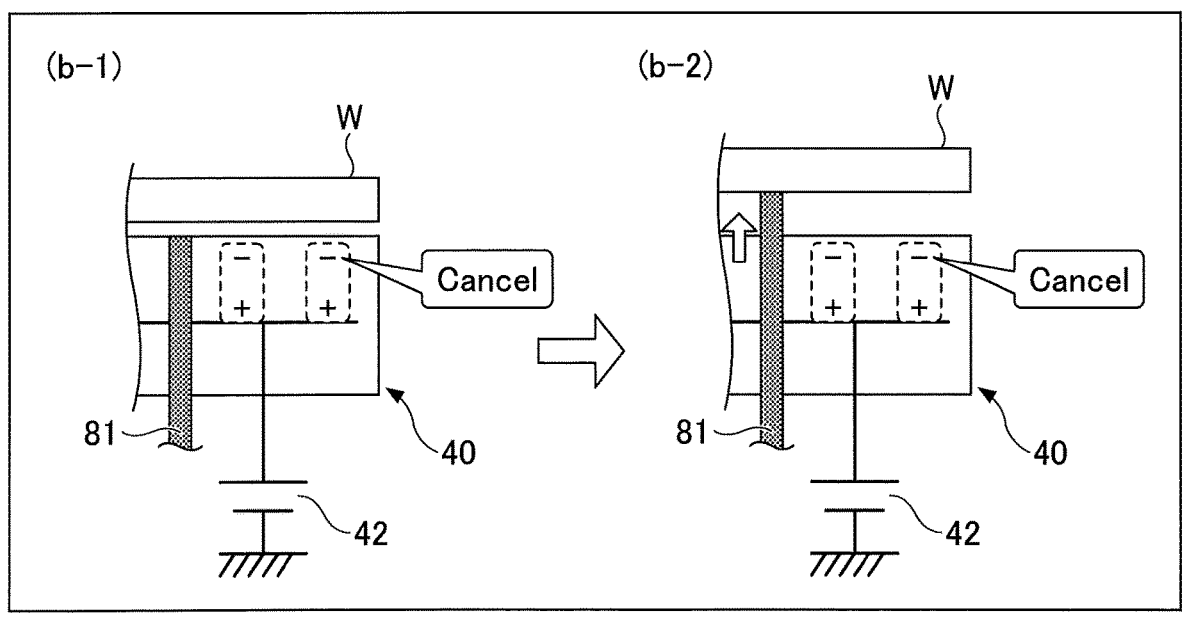
FIG. 3B is a diagram illustrating a state of the electrostatic chuck when a dechuck control method according to the embodiment is applied.

That is, in the present embodiment, voltage HV for cancelling remaining charge is supplied to the electrostatic chuck 40 without performing a discharge process. Accordingly, as illustrated in a left diagram in FIG. 3B (hereinafter, this diagram will be referred to as a "diagram (b-1)", and a right diagram in FIG. 3B will be referred to as a "diagram (b-2)"), electrical charge supplied to the electrostatic chuck 40 cancels remaining charge on the electrostatic chuck 40, and voltage of the electrostatic chuck 40 will be zero. Therefore, as illustrated in the diagram (b-2), because attractive force does not occur between the upper surface of the electrostatic chuck 40 and the back surface of the wafer W, the wafer W can be easily removed from the mounting base 12.

[Dechuck Control Process]

Figure 4:
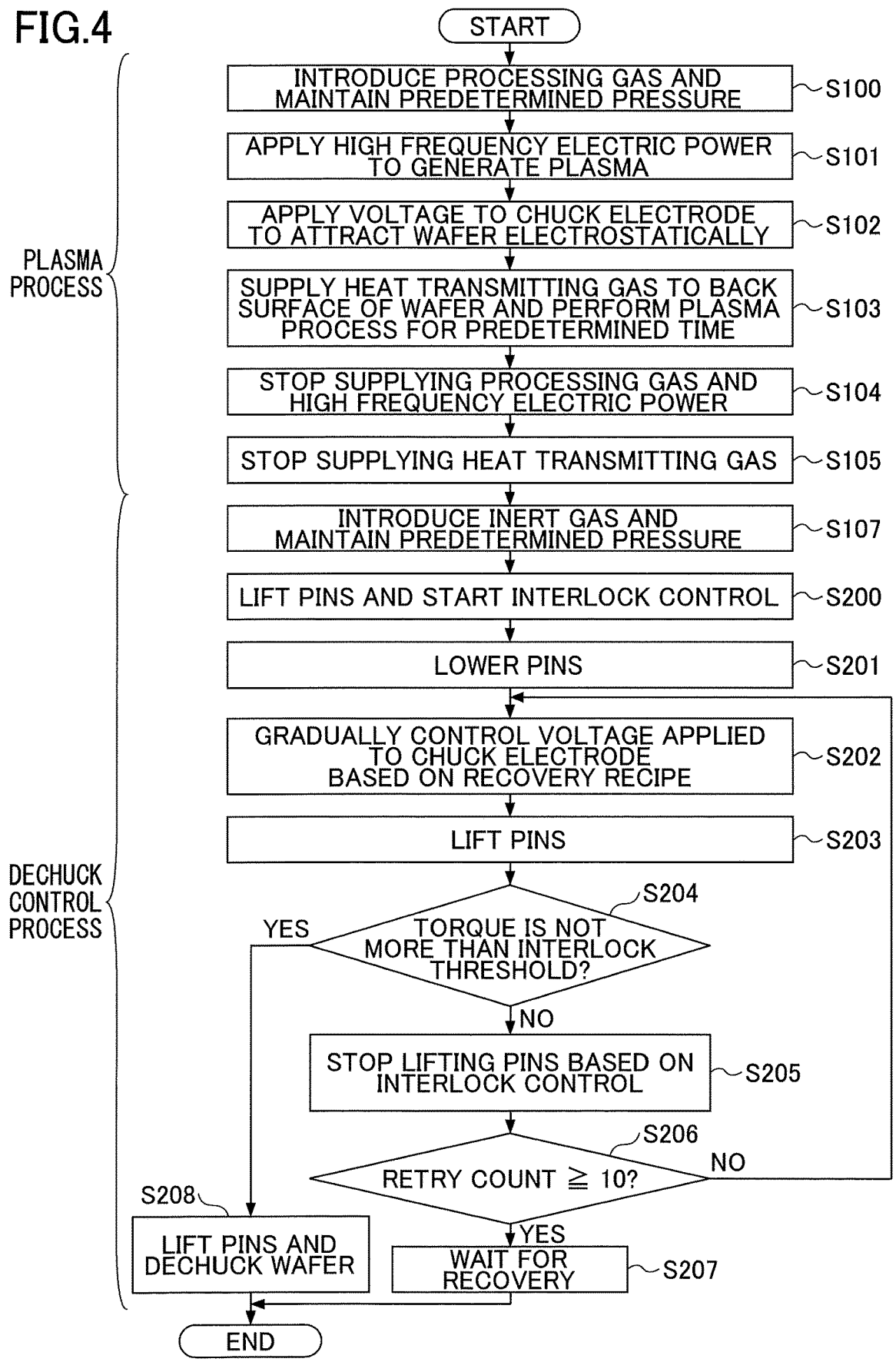
FIG. 4 is a flowchart illustrating the example of the dechuck control process according to the embodiment.

Next, an example of a dechuck control process according to the present embodiment will be described with reference to FIG. 4. FIG. 4 is a flowchart illustrating the example of the dechuck control process according to the present embodiment. In the dechuck control method according to the present embodiment, multiple recovery recipes 110a, . . . , 110n (collectively called "recovery recipe 110") that are stored in the memory 102 in FIG. 1 are used. The CPU 101 selects, among the multiple recovery recipes 110a, . . . , 110n stored in the memory 102, one recovery recipe 110, and uses the selected recovery recipe 110 for the dechuck control process. Note that the memory 102 is an example of a storage unit storing a relation between a predetermined voltage and the number of repetitions (retry counts) to be described below.

Further, in the present embodiment, when the dechuck control process illustrated in steps S107 to S208 in FIG. 4 is to be executed, the switch 43 maintains a state connected to the DC power source 42, and a given voltage (including 0 V) is applied to the chuck electrode 40a from the DC power source 42. Accordingly, while the chuck electrode 40a is connected to the DC power source 42, and voltage applied to the chuck electrode 40a is controlled by the CPU 101, voltage applied to the chuck electrode 40a is in a turned on state even in a state in which 0 V is applied to the chuck electrode 40a, and is not in a turned off state.

When a process illustrated in FIG. 4 is started, the plasma process (steps S100 to S105) is executed. Because operations performed in steps S100 to S105 of FIG. 4 are the same as operations in FIG. 2 having the same step numbers, descriptions of these operations will be omitted here. However, in the plasma process in FIG. 4, an operation for turning off voltage to the chuck electrode 40a that is performed at step S106 in FIG. 2 is not performed.

After the above mentioned plasma process, the dechuck control process according to the present embodiment (step S107 and steps S200 to S208) are executed. First, the CPU 101 executes an operation to introduce inert gas into the processing vessel 10, and to maintain the inside of the processing vessel 10 at a predetermined pressure (S107).

Next, as an initial process, the CPU 101 causes the supporting pins 81 to lift, starts an interlock control (step S200), and causes the supporting pins 81 to lower (step S201). In the interlock control, when the supporting pins 81 are lifted, whether or not an excessive torque is applied to the supporting pins 81 is checked. If the torque applied to the supporting pins 81 is higher than an interlock threshold, the motor 84 is stopped automatically, and lifting of the supporting pins 81 is stopped. The interlock control may be implemented by software (a program) or hardware.

Figure 6:
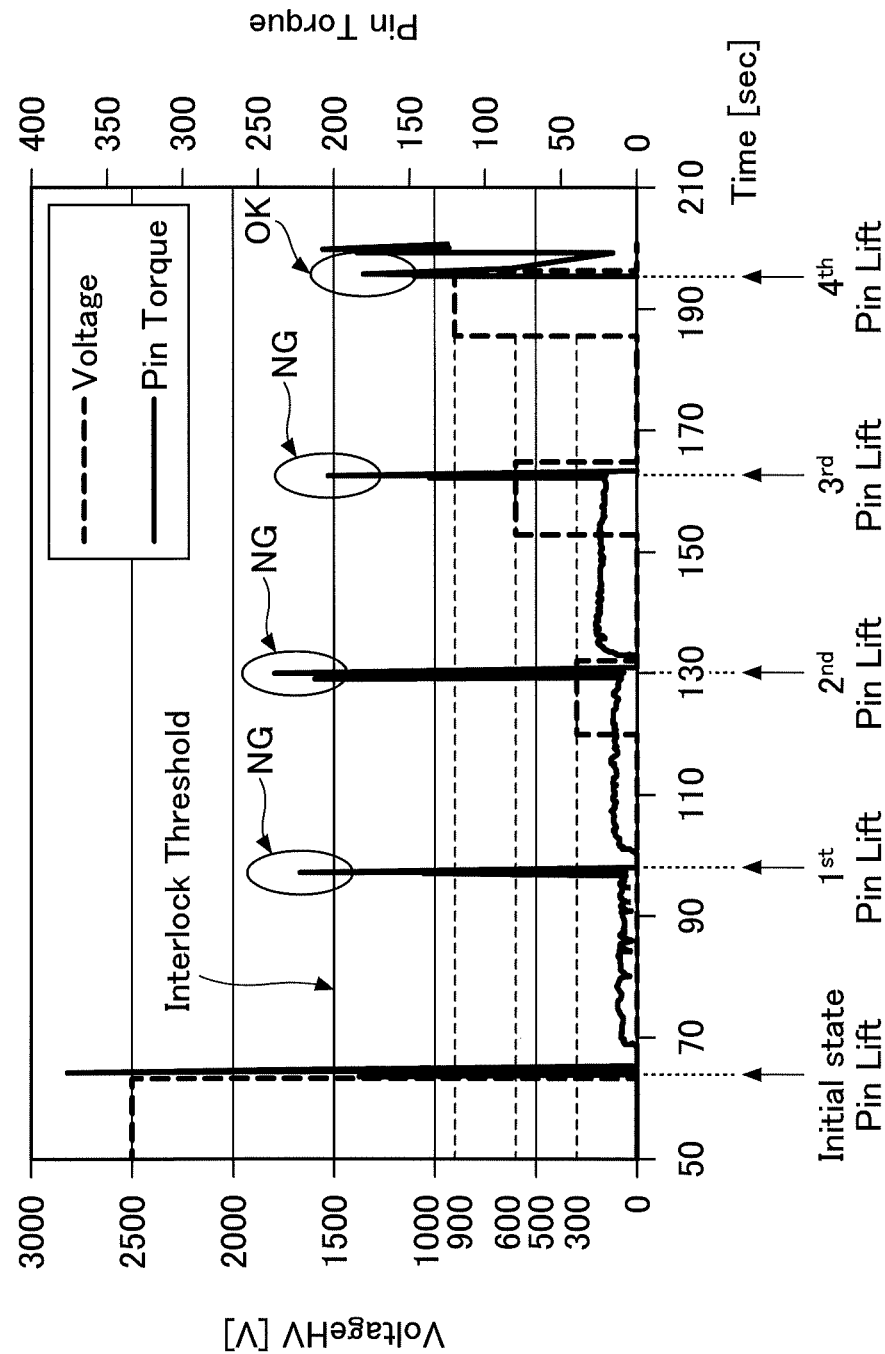
FIG. 6 is a graph illustrating an example of a series of sets of voltage applied to a chuck electrode and a torque applied to supporting pins in a dechuck control process according to the embodiment.

FIG. 6 is a graph illustrating an example of a sequence of sets of voltage applied to the chuck electrode 40a and a torque applied to the supporting pins 81 in the dechuck control process according to the present embodiment. In the graph illustrated in FIG. 6, a thick dotted line represents voltage HV applied to the chuck electrode 40a, and a thick solid line represents a torque applied to the supporting pins 81. Note that FIG. 6 represents an example of a series of torques applied to the supporting pins 81 when the voltage HV is controlled gradually such as in an order of 0 V, 300 V, 600 V, and 900 V.

As illustrated in FIG. 6, the voltage HV that is applied during the plasma process is 2500 V. The initial process performed at step S200 in FIG. 4 is performed just after stopping supply of the voltage HV of 2500 V, as illustrated in FIG. 6. In the initial process, at a time labeled as "Initial state Pin Lift" in FIG. 6, an initial operation of quickly bringing the supporting pins 81 to the back surface of the wafer is performed, by lifting the supporting pins 81. At this time, it is found that a large torque is applied to the supporting pins 81.

Figure 5:
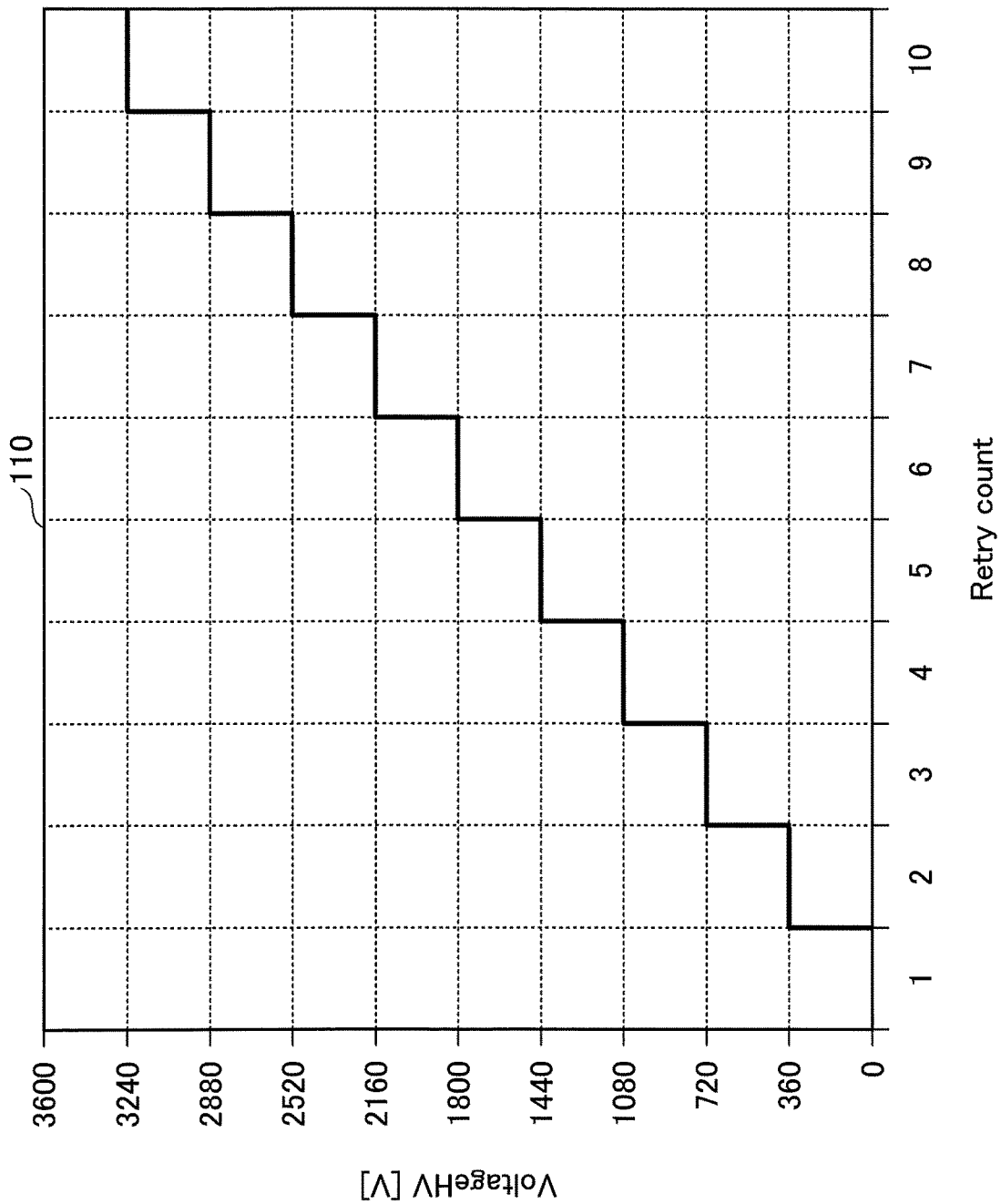
FIG. 5 is a diagram illustrating an example of a recovery recipe.

Referring back to FIG. 4, the CPU 101 next gradually controls the voltage HV applied to the chuck electrode 40a, based on the recovery recipe 110 (step S202). FIG. 5 is a diagram illustrating an example of the recovery recipe 110 as a graph. A horizontal axis of FIG. 5 represents the number of times (retry count) that an operation of removing the wafer W has been tried. A vertical axis of FIG. 5 represents the voltage HV applied to the chuck electrode 40a. In the present embodiment, the CPU 101 gradually increases the voltage HV applied to the chuck electrode 40a in accordance with a magnitude of the retry count, based on the recovery recipe 110 illustrated in FIG. 5.

Specifically, at step S202 in FIG. 4, by referring to the recovery recipe 110 in FIG. 5, the CPU 101 sets the voltage HV applied to the chuck electrode 40a, in a case in which the retry count is an initial value (=1), to 0 V.

When the voltage HV is in the above mentioned state, the CPU 101 causes the supporting pins 81 to lift (step S203), and the CPU 101 determines whether or not the torque applied to the supporting pins 81 is not more than the interlock threshold (step S204). If it is determined that the torque applied to the supporting pins 81 is more than the interlock threshold, the CPU 101 stops lifting the supporting pins 81 by the interlock control (step S205), and determines if the retry count is not less than 10 (step S206).

If it is determined that the retry count is less than 10, the CPU 101 gradually controls the voltage HV applied to the chuck electrode 40a, based on the recovery recipe 110 (step S202). At this point of time, the CPU 101 sets the voltage HV applied to the chuck electrode 40a to 360 V in accordance with the magnitude of the retry count, by referring to the recovery recipe 110 in FIG. 5.

When the voltage HV is set to 360 V, the CPU 101 again causes the supporting pins 81 to lift (step S203), and the CPU 101 determines whether or not the torque applied to the supporting pins 81 is not more than the interlock threshold (step S204). The CPU 101 repeats steps S202 to S206 until it is determined that the torque applied to the supporting pins 81 is not more than the interlock threshold.

The magnitude of the torque applied to the supporting pins 81 when the wafer W is lifted by the supporting pins 81 with the voltage HV set to 360 V at step S202 in FIG. 4, based on the recovery recipe 110 in FIG. 5, is illustrated in FIG. 6, at a time labeled as "$2^{nd}$ Pin Lift" (retry count=2) in FIG. 6. When the retry count is 2, the torque exceeds the interlock threshold. Therefore, the CPU 101 stops lifting the supporting pins 81 by the interlock control.

Next, the magnitude of the torque applied to the supporting pins 81 when the wafer W is lifted by the supporting pins 81 with the voltage HV set to 720 V at step S202 in FIG. 4, based on the recovery recipe 110 in FIG. 5, is illustrated in FIG. 6, at a time labeled as "$3^{rd}$ Pin Lift" (retry count=3) in FIG. 6. When the retry count is 3, the torque exceeds the interlock threshold. Therefore, the CPU 101 stops lifting the supporting pins 81 by the interlock control.

Next, the magnitude of the torque applied to the supporting pins 81 when the wafer W is lifted by the supporting pins 81 with the voltage HV set to 1080 V at step S202 in FIG. 4, based on the recovery recipe 110 in FIG. 5, is illustrated in FIG. 6, at a time labeled as "$4^{th}$ Pin Lift" (retry count=4) in FIG. 6. When the retry count is 4, the torque is equal to or less than the interlock threshold. Therefore, the CPU 101 does not stop lifting the supporting pins 81 by the interlock control.

Referring back to FIG. 4, the CPU 101 dechucks the wafer W from the mounting base 12 by lifting the supporting pins 81 (step S208), turns off the voltage to the chuck electrode 40a by switching to a state of the switch 43 in which the chuck electrode 40a is connected to the ground 44, and terminates the process.

If it is determined that, at step S206, the retry count is not less than 10, the CPU 101 determines that the wafer W cannot be removed because of a reason other than occurrence of attractive force by remaining charge, and the CPU 101 waits for completion of a recovery process (step S207). After step S207, the process terminates. An example of the reason other than occurrence of attractive force by remaining charge includes failure of the motor 84.

In the recovery process, for example, investigation of the problem or maintenance of a part where the problem has occurred is performed, by opening a lid of the processing vessel 10. After the recovery process is completed, the plasma processing apparatus 1 is restarted to perform a plasma process of a next wafer.

The retry count (the number of repetitions) is not limited to 10, and a predetermined limit value can be used as the retry count. That is, at step S206, in a case in which the number of repetitions exceeds the predetermined limit value, maintenance of the plasma processing apparatus 1 is performed.

As described above, in the dechuck control method according to the present embodiment, voltage HV in accordance with remaining electrical charge is supplied to the electrostatic chuck 40, without turning off the voltage HV. Accordingly, because electrical charge that is brought by the voltage HV supplied to the chuck electrode 40a cancels the remaining charge on the electrostatic chuck 40, voltage of the electrostatic chuck 40 becomes zero. As a result, as illustrated in the diagram (b-2) in FIG. 3B, attractive force does not occur between the surface of the electrostatic chuck 40 and the back surface of the wafer W, when the wafer is lifted by the supporting pins 81. Therefore, the wafer W can be removed easily from the mounting base 12.

In the graph illustrated in FIG. 5, a case in which the increment of the voltage HV is 360 V is described. In the case illustrated in FIG. 5, as the retry count is increased by one, the CPU 101 applies voltage obtained by adding 360 V to the current voltage HV to the chuck electrode 40a. However, the graph illustrated in FIG. 5 merely represents an example of increment of the voltage HV to gradually control the voltage HV applied to the chuck electrode 40a, and increment of the voltage HV is not limited to the above example. Remaining charge accumulated in the electrostatic chuck 40 varies depending on process conditions. For example, depending on polarity of the voltage HV applied to the chuck electrode 40a during a plasma process, whether the graph illustrated in FIG. 5 becomes a monotonically increasing graph or a monotonically decreasing graph varies.

Further, because the above mentioned increment of the voltage HV is merely an example, the magnitude of increment of the voltage HV may preferably be changed in accordance with process conditions such as degrees of high frequency electric power for generating plasma, high frequency electric power for bias voltage, and the voltage HV having been applied to the chuck electrode 40a during a plasma process. Further, in the graph illustrated in FIG. 5, the voltage HV is 0 V in a case in which the retry count is 1, but is not limited to 0 V. The voltage HV in a case in which the retry count is 1 may be a negative value or a positive value.

As described above, it is preferable that multiple graphs which were configured depending on process conditions are prepared as the recovery recipes 110 in advance and that the multiple graphs are stored in the memory 102. In this case, an operator selects one of the recovery recipes 110 that fits a process condition, and performs the dechuck control process according to the present embodiment.

As described above, by performing the dechuck control method according to the present embodiment using the plasma processing apparatus 1 according to the present embodiment, a wafer W can be dechucked from the electrostatic chuck 40 easily.

In the above embodiment, a dechuck control method and a plasma processing apparatus have been described. However, a dechuck control method and a plasma processing apparatus according to the present invention are not limited to the above embodiment. Various changes or enhancements can be made hereto within the scope of the present invention. Matters described in the above embodiments may be combined unless inconsistency occurs.

For example, in the above embodiment, as an example of a step of determining whether or not a value in accordance with remaining charge on the electrostatic chuck 40 is not more than a predetermined threshold, a determination is performed at step S204 in FIG. 4 whether or not a torque applied to the supporting pins 81 when a wafer W is lifted by the supporting pins 81 is not more than the interlock threshold. However, "a value in accordance with remaining charge" is not limited to the torque. For example, "a value in accordance with remaining charge" may be magnitude of current flowing through the DC power source 42 when a wafer W is lifted by the supporting pins 81. If a wafer W is moved by lifting the supporting pins 81 while remaining charge is still in the electrostatic chuck 40, electrical charge moves between the DC power source 42 and the electrostatic chuck 40 because capacitance between the DC power source 42 and the electrostatic chuck 40 changes. Accordingly, current flows between the DC power source 42 and the electrostatic chuck 40. To utilize the current, the following method may be employed. That is, an ammeter may be installed at the feeding rod 36 for connecting the DC power source 42 with the electrostatic chuck 40, an amount of remaining charge may be estimated by a current value measured by the ammeter, and voltage HV required for cancelling the remaining charge may be applied to the chuck electrode 40*a*. By employing this method, remaining charge in the electrostatic chuck 40 will be cancelled, and voltage of the electrostatic chuck 40 will be able to be set to zero. As a result, a wafer W can be removed from the mounting base 12 easily.

A table recording a relation between voltage applied to the chuck electrode 40*a* and a torque required for applying to the supporting pins 81 to remove a wafer W may be prepared in advance. In this case, when the CPU 101 detects a torque applied to the supporting pins 81, the CPU 101 can derive the sufficient voltage to be applied to remove a wafer W, by referring to the table, cancel remaining charge in the electrostatic chuck 40, and remove the wafer W safely. In this case, the CPU 101 does not need to gradually control voltage applied to the chuck electrode 40*a*.

The plasma processing apparatus according to the present invention can be applicable to any type of plasma processing apparatuses, such as a capacitively coupled plasma (CCP) type, an inductively coupled plasma (ICP) type, a radial line slot antenna type, an electron cyclotron resonance plasma (ECR) type, and a helicon wave plasma (HWP) type.

In this specification, the semiconductor wafer is referred to as an example of a processed object. However, the processed object is not limited to the semiconductor wafer. Examples of the processed object may include various types of substrates used in an LCD (Liquid Crystal Display) or a FPD (Flat Panel Display), a CD substrate, or a printed circuit board.

What is claimed is:

1. A dechuck control method of dechucking a processed object electrostatically attracted to an electrostatic chuck provided in a plasma processing apparatus, the method comprising:
dechucking the processed object by lifting the processed object with a supporting mechanism, the dechucking being performed while applying a given voltage to an electrode of the electrostatic chuck and while a plasma is not generated in the plasma processing apparatus.

2. The method according to claim 1, wherein the dechucking further comprises:
checking whether or not a value in accordance with remaining charge in the electrostatic chuck is not more than a predetermined threshold, while applying the given voltage to the electrode of the electrostatic chuck, and
determining that the processed object can be dechucked, in accordance with a result of the checking.

3. The method according to claim 2, further comprising:
calculating a magnitude of the given voltage applied to the electrode of the electrostatic chuck, in accordance with a result of the determining.

4. The method according to claim 2, wherein the value in accordance with remaining charge in the electrostatic chuck is a torque applied to the supporting mechanism when the processed object is to be lifted.

5. The method according to claim 2, wherein the value in accordance with remaining charge in the electrostatic chuck is a magnitude of current flowing between the electrode and a DC power source connected to the electrode.

6. The method according to claim 2, further comprising:
changing the given voltage applied to the electrode of the electrostatic chuck gradually, in a case in which the value in accordance with remaining charge in the electrostatic chuck is more than the predetermined threshold as the result of the checking, and
repeating the checking and the changing until the value in accordance with remaining charge in the electrostatic chuck becomes not more than the predetermined threshold.

7. The method according to claim 6, wherein the given voltage applied to the electrode of the electrostatic chuck is calculated by referring to a storage unit storing a relationship between the given voltage applied to the electrode of the electrostatic chuck and a number of times of the repeating.

8. The method according to claim 7, wherein, for each instance of the changing, the given voltage applied to the electrode of the electrostatic chuck is incremented or decremented by a predetermined value.

9. The method according to claim 7, further comprising:
performing maintenance of the plasma processing apparatus for processing the processed object attracted to the electrostatic chuck electrostatically, in a case in which the number of times of the repeating exceeds a predetermined limit value.

10. A plasma processing apparatus comprising:
an electrostatic chuck configured to attract a processed object electrostatically;
a DC power source applying a voltage to an electrode of the electrostatic chuck; and
a control unit configured to dechuck the processed object by lifting the processed object with a supporting mechanism, while applying a given voltage to the electrode of the electrostatic chuck and while a plasma is not generated in the plasma processing apparatus.

11. The plasma processing apparatus according to claim 10, wherein the control unit is configured
to perform a check as to whether or not a value in accordance with remaining charge in the electrostatic chuck is not more than a predetermined threshold, while applying the given voltage to the electrode of the electrostatic chuck, and
to perform a determination that the processed object can be dechucked, in accordance with a result of the check.

12. The plasma processing apparatus according to claim 11, wherein the control unit is configured to calculate a magnitude of the given voltage applied to the electrode of the electrostatic chuck, in accordance with a result of the determination.

* * * * *